United States Patent [19]
Ota

[11] Patent Number: 5,981,116
[45] Date of Patent: Nov. 9, 1999

[54] ALIGNMENT IN A PROJECTION EXPOSURE METHOD

[75] Inventor: Kazuya Ota, Tokyo, Japan

[73] Assignee: Nikon Corporation, Tokyo, Japan

[21] Appl. No.: 08/989,518

[22] Filed: Dec. 12, 1997

[30] Foreign Application Priority Data

Dec. 12, 1996 [JP] Japan ................................ 8-331846

[51] Int. Cl.$^6$ ................................................ G03F 9/00
[52] U.S. Cl. ........................................ 430/22; 430/30
[58] Field of Search ................................. 430/22, 30

[56] References Cited

U.S. PATENT DOCUMENTS 5,646,413 7/1997 Nishi ........................................ 250/548

*Primary Examiner*—Christopher G. Young
*Attorney, Agent, or Firm*—Armstrong, Westerman, Hattori, McLeland & Naughton

[57] ABSTRACT

A plurality of pairs of alignment marks are formed on a reticle along a scanning direction, and, when a first wafer is to be exposed, a base line amount of an alignment sensor is measured by using a first pair of alignment marks (steps 112, 113, 115), and, when a second wafer is to be exposed, the base line amount is measured by using a second pair of alignment marks and a magnification error of the reticle in the scanning direction is determined on the basis of positional displacement amounts of the alignment marks measured regarding the first wafer and positional displacement amounts of the alignment marks measured regarding the second wafer (step 115), whereby the magnification error of the reticle in the scanning direction is measured with high accuracy, without making a measuring device complicated and reducing through-put of the exposure process.

20 Claims, 8 Drawing Sheets

| Fig. 1A | Fig. 1B |

101 — EXCHANGE RETICLE

102 — DRIVE WAFER STAGE TO MOVE PAIR OF REFERENCE MARKS 24A, 25A ON REFERENCE MARK MEMBER 8 TO POSITION WITHIN OBSERVING AREAS OF RA MICROSCOPES 10, 11 AND THEN STOP WAFER STAGE

103 — MOVE FIRST ALIGNMENT MARKS 22A, 23A ON RETICLE 1 TO BE ALIGNED WITH IMAGES OF REFERENCE MARKS 24A, 25A AT THEIR CENTERS AND DETECT POSITIONAL DISPLACEMENT AMOUNTS ($\Delta xA1$, $\Delta yA1$), ($\Delta xB1$, $\Delta yB1$) OF TWO MARKS BY RA MICROSCOPES 10, 11

104 — DETECT POSITIONAL DISPLACEMET AMOUNTS ($\Delta xC1$, $\Delta yC1$) OF REFERENCE MARK 26A BY ALIGNMENT SENSOR 16

105 — DRIVE RETICLE STAGE 2 TO MOVE SECOND ALIGNMENT MARKS 22B, 23B ON RETICLE 1 TO BE ALIGNED WITH IMAGES OF REFERENCE MARKS 24A, 25A AT THEIR CENTERS AND DETECT POSITIONAL DISPLACEMENT AMOUNTS ($\Delta xA2$, $\Delta yA2$), ($\Delta xB2$, $\Delta yB2$) OF TWO MARKS 106 — DRIVE RETICLE STAGE 2 TO MOVE THIRD ALIGNMENT MARKS 22C, 23C ON RETICLE 1 TO BE ALIGNED WITH IMAGES OF REFERENCE MARKS 24A, 25A AT THEIR CENTERS AND DETECT POSITIONAL DISPLACEMENT AMOUNTS ($\Delta xA3$, $\Delta yA3$), ($\Delta xB3$, $\Delta yB3$) OF TWO MARKS 107 — DETERMINE AVERAGE POSITIONAL DISPLACEMENT AMOUNTS OF RETICLE 1 AND DETERMINE OFFSET OF CO-ORDINATE SYSTEM OF RETICLE STAGE WITH RESPECT TO CO-ORDINATE SYSTEM OF WAFER STAGE 108 — DETERMINE MAGNIFICATION ERROR ($\Delta MRY$) OF RETICLE 1 TO DETERMINE SCANNING SPEED RATIO

109 — DETERMINE BASE LINE AMOUNTS (BLX, BLY) OF ALIGNMENT SENSOR 16

END

ALIGNMENT IN A PROJECTION EXPOSURE METHOD

BACKGROUND OF THE INVENTION

The present invention relates to a projection exposure method for transferring a pattern of a mask onto a photosensitive substrate in a photolithography process for manufacturing semi-conductor elements, imaging elements (charge-coupled devices and the like), liquid crystal display elements or thin-film magnetic heads, which method is particularly applicable to a scanning exposure apparatus of step-and-scan type in which exposure is performed while scanning the mask and the photosensitive substrate are scanned in a synchronous manner.

As a related art, when a semi-conductor element is manufactured, a projection exposure apparatus for transferring a pattern of a reticle (as a mask) onto a wafer (or a glass plate or the like) on which photo-resist is coated through a projection optical system is used. Recently, in order to respond to a request that an area of a pattern to be transferred should become larger without making the projection optical system larger, there is proposed a projection exposure apparatus of step-and-scan type in which, after a wafer is stepped to a scan start position, by scanning a reticle and the wafer with respect to the projection optical system in a synchronous manner, a pattern image of the reticle is successively transferred onto shot areas on the wafer.

In the scanning exposure apparatus such as the projection exposure apparatus of step-and-scan type, since the pattern image of the reticle must be aligned with each shot area on the wafer with high accuracy during the exposure, there are provided a reticle alignment microscope for detecting positions of alignment marks on the reticle, and a wafer alignment sensor for detecting positions of alignment marks (wafer marks) on the wafer. When the reticle is exchanged for another one, the reticle is aligned with a wafer stage by using the reticle alignment microscope, and, when the wafer is exchanged for another one, the position of each shot area on the wafer is measured by using the wafer alignment sensor. Then, scanning exposure is performed in a condition that the pattern image of the reticle is overlapped with each shot area on the basis of the measured result.

In this case, for example, by detecting a position of a corresponding reference mark on the wafer by using the wafer alignment sensor while observing the corresponding alignment mark by using the reticle alignment microscope, a relative distance (i. e., base line amount) between a projection position (i. e., exposure center) of the reticle pattern image and a detection position (i. e., detection center) of the wafer alignment sensor is determined. A process for measuring the base line amount in this way is called as "base line check". By correcting the measured amount obtained by the wafer alignment sensor by the base line amount, the reticle pattern image can be overlapped with each shot area on the wafer with high accuracy.

In the above-mentioned scanning exposure apparatus, as mentioned above, the alignment between the reticle and each shot area on the wafer is performed by using the reticle alignment microscope and the wafer alignment sensor. However, for example, when one lot of wafers are successively exposed by using a single reticle, the reticle is thermally expanded gradually due to repeated illumination of exposure light illuminated onto the reticle, with the result that a length of the circuit pattern described on the reticle is gradually changed. Further, there is a danger of deviating the length of the circuit pattern from a design value due to the describing error. When it is assumed that the actual length of the circuit pattern described on the reticle is LR and the design length of the circuit pattern is $LR_0$, a magnification error (%) of the reticle is represented as follows:

$$100 \times (LR - LR_0)/LR_0$$

If such a magnification error of the reticle exceeds a limit of an allowable range, an error in overlap (hereinafter called "overlap error") between the reticle pattern image and each shot area (chip pattern) on the wafer will also exceed a limit of an allowable range, thereby worsening the yield of the semi-conductor elements finally obtained.

Regarding this, for example, by arranging a pair of reticle alignment microscopes along a non-scanning direction on the reticle, when the base line check is effected, the magnification error of the reticle in the non-scanning direction can be MEASURED by detecting a displacement amount of a distance between two alignment marks. If the magnification error in the non-scanning direction can be measured correctly in this way, the overlap error in the non-scanning direction can be reduced, for example, by adjusting projection magnification of the projection optical system accordingly.

Further, in the scanning exposure apparatus, if the magnification error of the reticle in a scanning direction can be measured correctly, the overlap error in the scanning direction can also be reduced, for example, by correcting a value of a ratio between a scanning speed of the reticle and a scanning speed of the wafer in accordance with the magnification error.

Thus, it could be considered that the magnification error of the reticle in the scanning direction is measured by arranging a pair of reticle alignment microscopes along the scanning direction on the reticle. However, since a projection area of the projection optical system used in the exposure apparatus of step-and-scan type is narrow (for example, slit) in the scanning direction, a distance between the pair of reticle alignment microscopes along the scanning direction must be so short corresponding to the narrow projection area, and it is therefore difficult to arrange them. Consequently, it is difficult to measure the magnification error in the scanning direction with high accuracy. Further, if additional reticle alignment microscope(s) for measuring the magnification error in the scanning direction is provided, in addition to the reticle alignment microscopes disposed along the non-scanning direction or in combination with the latter, the entire apparatus would be complicated and costly.

Further, since through-put (productivity) must be improved in the manufacturing process of the semi-conductor elements, it is desirable that the magnification error in the scanning direction is measured more efficiently.

SUMMARY OF THE INVENTION

An object of the present invention is to provide a projection exposure method in which a pattern on a mask is transferred onto a substrate with high accuracy.

Another object of the present invention is to provide a projection exposure method in which positions of a plurality of alignment marks formed on a mask along a scanning direction are successively measured while moving the mask by using a pair of alignment microscopes arranged along a non-scanning direction on the mask, thereby determining amounts of positional displacement of each alignment mark. With this method, magnification error of the mask in the scanning direction can be measured with high accuracy without providing any additional measuring device(s) (i.e., without making the measuring device complicated). Further, since the position of the respective alignment mark along the scanning direction is measured whenever the exposure is effected regarding each of the predetermined number of photosensitive substrates, the through-put of the exposure process is not worsened. That is to say, the exposure apparatus can be made cheaper and, at the same time, high through-put can be obtained.

A further object of the present invention is to provide a projection exposure method in which a plurality of reference marks are formed, along a scanning direction and corresponding to a plurality of alignment marks on a mask, on a stage on which a photosensitive substrate is rested, and, when one of the plurality of alignment marks on the mask is positioned at a predetermined position by moving the mask, one of the plurality of reference marks corresponding to the selected alignment mark is positioned at a position corresponding to the predetermined position. With this method, since the global magnification error of the mask in the scanning direction including displacement in the ratio between the measured values of the position detecting devices for the mask and the photosensitive substrate can be determined, overlap accuracy can be improved by correcting, for example, a scanning speed ratio in accordance with the magnification error.

A further object of the present invention is to provide a projection exposure method in which, when a relative distance between a projection position of a mask pattern image and a detection position of a mark detection system is firstly determined, projection positions of a plurality of alignment marks of the mask are measured, respectively, and, on the basis of measured results, a relative distance (i. e., relative positional relationship or base line amount) between the projection position of the mask pattern image and the detection position of the mark detection system is determined. With this method, the base line amount of the mark detection system can be obtained with higher accuracy by the obtained averaging effect.

To achieve the above objects, according to the present invention, there is provided a projection exposure method in which a photosensitive substrate (5) is aligned with a mask (1) by detecting a position of at least one alignment mark on the photosensitive substrate (5) by using a mark detection system (16) and in which a pattern of the mask (1) is transferred onto the photosensitive substrate (5) by scanning the mask (1) and the photosensitive substrate (5) in a synchronous manner, the exposure method comprising a first step (112, 113) for positioning the mask (1) in such a manner that a first mark (22A, 23A) among a plurality of alignment marks (22A, 23A~22C, 23C) formed on the mask (1) along a scanning direction thereof is brought to a predetermined position and for measuring a projection position of an image of the first mark, and a second step (115) for determining a relative positional relationship; base line amount) between a projection position of an image of the pattern of the mask (1) and a detection position of the mark detection system (16) on the basis of the projection position of the image of the first mark.

The projection exposure method according to the present invention further comprises a third step (112, 113) for positioning the mask (1) in such a manner that a second mark (22C, 23C) different from the first mark (22A, 23A) among the plurality of alignment marks formed on the mask (1) along a scanning direction thereof is brought to a predetermined position and for measuring a projection position of an image of the second mark, after the pattern of said mask is transferred onto each of the predetermined number of photosensitive substrates by using he determined position, and a fourth step (114, 115) for determining the relative positional relationship between the projection position of the image of the pattern of the mask (1) and the detection position of the mark detection system (16) on the basis of the projection position of the image of the second mark after the third step and for determining a magnification error (for example, pattern error) in the scanning direction thereof on the basis of the projection positions of the images of the first and second marks.

According to the present invention, a pair of alignment microscopes (10, 11) are disposed above the mask (1) along a non-scanning direction thereof, and, prior to exposure of a first photosensitive substrate, a positional displacement amount of the projection position (on the photosensitive substrate) of the image of the first mark (22A, 23A) of the mask (1) is measured by the alignment microscopes, and, a positional displacement amount of a predetermined reference mark is detected by the mark detection system (16). In this case, distances between the alignment microscopes and the reference mark are previously sought, and, the base line amount of the mark detection system (16) can be determined by correcting the distances by using the positional displacement amounts. A pattern error of the mask (1) in the non-scanning direction can also be determined.

And, prior to exposure of a second photosensitive substrate, the mask (1) is moved, with respect to the position of the mask prior to the exposure of the first photosensitive substrate, in the scanning direction by a predetermined distance, so that a positional displacement amount of the projection position (on the photosensitive substrate) of the image of the second mark (22C, 23C) of the mask (1) can be measured by the alignment microscopes and a positional displacement amount of a predetermined reference mark can be detected by the mark detection system (16). Since a distance between the first mark (22A, 23A) and the second mark (22C, 23C) of the mask (1) can be determined on the basis of the measured results, the pattern error of the mask (1) in the scanning direction can be determined by comparing such a distance with a design distance value. The overlap accuracy is improved by correcting a scanning speed ratio between the mask and the photosensitive substrate in accordance with such pattern error.

In this case, in correspondence to the plurality of alignment marks (22A, 23A~22C, 23C) on the mask (1), a plurality of reference marks (24A, 25A~24C, 25C) may be formed along the scanning direction thereof on a stage (6) (on which the photosensitive substrate is rested), so that, hen the mask (1) is moved in order to position one of the alignment marks at its predetermined position, the stage (6) is also moved in order to position the corresponding one reference mark (among the plurality of reference marks) at a position corresponding to the predetermined position.

With this arrangement, for example, when the mask (1) is moved in the scanning direction by the predetermined distance, by moving the stage (6) associated with the photosensitive substrate by a distance obtained by magnification correction, a positional displacement amount between two corresponding marks can be detected. Since the global pattern error of the mask in the scanning direction including displacement in ratio between the measured values of the position detecting devices (for example, laser interferometers) for the mask and the photosensitive substrate can be determined from this positional displacement amount, by correcting the scanning speed ratio on the basis of the pattern error, the overlap accuracy can be further improved.

Further, the second step may comprise the steps for measuring the projection positions of the images of the plurality of alignment marks (22A, 23A–22C, 23C) on the mask (1), respectively (steps 103–106), and for determining the relative positional relationship (base line amount) between the projection position of the pattern image of the mask (1) and the detection position of the mark detection system (16) on the basis of the measured results (steps 107, 109). In this case, since the averaging effect can be obtained, the base line amount can be measured with higher accuracy.

Further, according to the present invention, there is provided a scanning exposure method for transferring a pattern on a mask onto a substrate through a projection optical system, by moving the mask and the substrate in synchronous manner, comprising a first step of obtaining an information on projection position of an image of the pattern of the mask by detecting a first mark formed on the mask; a second step of obtaining an information on projection position of an image of the pattern of the mask by detecting a second mark which is formed apart from the first mark on the mask in a synchronous movement direction; and a third step of obtaining a magnification error in the synchronous movement direction, based on the information on the first mark and the second mark, said pattern error being generated between said first and second steps.

Further, according to the present invention, there is provided an exposure method for transferring a pattern on a mask onto a substrate through a projection optical system, comprising a first step of detecting a first mark formed on the mask while measuring the position of the mask; a second step of detecting a second mark formed on the mask while measuring the position of the mask, a position of the second mark on the mask being different from that of the first mark thereon; and a third step of obtaining a magnification error based on an information on a position of the mask, an information on detection of the first mark and an information on detection of the second mark, said pattern error being generated between said first and second steps.

Further, according to the present invention, there is provided an exposure method which projects an image of a pattern formed on a mask onto a substrate, comprising a first step of detecting a first mark formed on the mask; a second step of detecting a second mark formed on the mask, a position of the second mark on the mask being different from that of the first mark thereon; and a third step of obtaining a projection error based on an information on detection of the first mark and an information on detection of the second mark, said pattern error being generated between said first and second steps.

BRIEF DESCRIPTION OF THE DRAWINGS

FIGS. 1A and 1B are flow charts showing reticle alignment and an exposure operation in a preferred embodiment of the present invention;

DETAILED DESCRIPTION OF PREFERRED EMBODIMENTS

The present invention will now be explained in connection with an embodiment thereof with reference to the accompanying drawings. This embodiment is applied to a case where exposure is effected by using a projection exposure apparatus of step-and-scan type.

Figure 2:
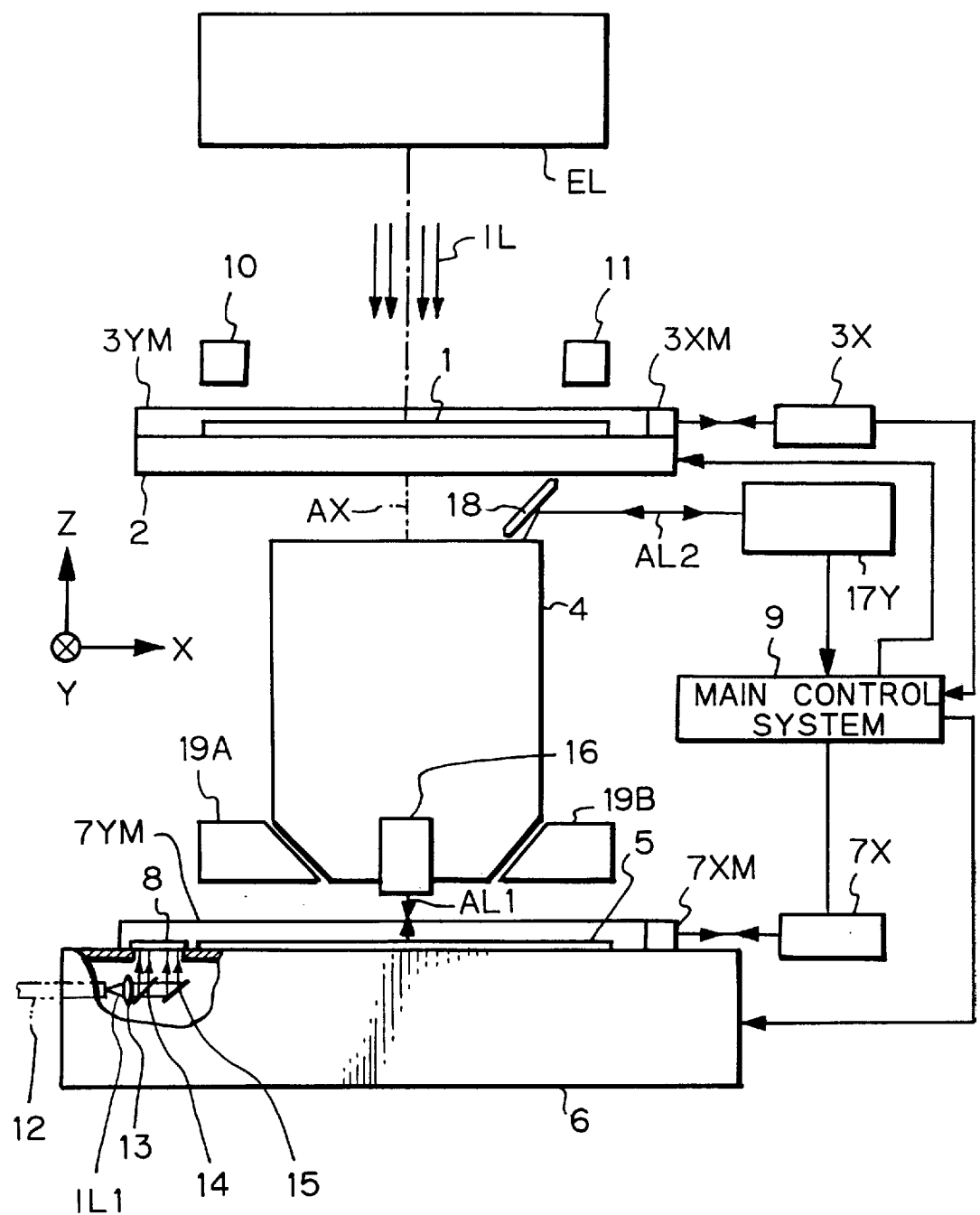
FIG. 2 is a constructural view, in partial section, showing a projection exposure apparatus used in the preferred embodiment of the present invention.

FIG. 2 shows a projection exposure apparatus associated with this embodiment. In FIG. 2, during exposure, a pattern on a reticle 1 is illuminated by slit-shaped illumination zones of exposure light IL from an illumination optical system EL, and an image of the pattern is projected onto a wafer 5 on which photo-resist is coated, through a projection optical system 4. As the exposure light IL, either a blight light such as i-ray light from a mercury lamp or excimer laser light may be used. In this case, if it is assumed that there is no magnification error of the reticle, in synchronous with the fact that the reticle 1 is scanned in an upward direction (or a downward direction) perpendicular to the paper plane of FIG. 2 at a constant speed VR with respect to the slit-shaped illumination zones of the exposure light IL, the wafer 5 is scanned in the downward direction (or the upward direction) perpendicular to the paper plane of FIG. 2 at a constant speed $\beta \cdot VR$ ($\beta$ is projection magnification, for example, ¼, ⅕ or the like), of the projection optical system 4. Now, explanation will be continued by assuming that a direction parallel to an optical axis AX of the projection optical system is Z-axis, a direction perpendicular to the Z-axis and parallel to the paper plane of FIG. 2 is X-axis and a direction (scanning direction) perpendicular to both the Z-axis and to the paper plane of FIG. 2 is Y-axis.

In this case, the reticle 1 is held on a reticle stage 2, and the reticle stage 2 serves to move the reticle 1 in the Y-direction (Y-axis) at a constant speed and to adjust a position of the reticle 1 in the X-direction (X-axis), Y-direction and a rotational direction. An X-axis movable mirror 3XM and a Y-axis movable mirror 3YM are disposed on the reticle stage 2, and an X-axis laser interferometer 3X and a Y-axis laser interferometer (not shown) are disposed in an opposed relation to the movable mirrors 3XM, 3YM so that information regarding an X-coordinate XR, an Y-coordinate YR and a rotational angle of the reticle stage 2 always obtained from the laser interferometers is supplied to a main control system 9 for controlling the operation of the entire apparatus. The main control system 9 controls the operation of the reticle stage 2 on the basis of the positional information. The co-ordinate system including the X-coordinate XR and Y-coordinate YR of the reticle stage 2 measured by the interferometers 3X and the like is called as the co-ordinate system (XR, YR) of the reticle stage.

Two reticle alignment microscopes (hereinafter called "RA microscopes") 10, 11 are disposed above the reticle 1 along a non-scanning direction (X-direction), as disclosed in U.S. Pat. No. 5,646,413. The RA microscopes 10, 11 include focusing systems and imaging elements such as two-dimensional CCD or the like, whereby the images of alignment marks on the reticle and reference marks 23–29 (described later) disposed adjacent to the wafer 5 are viewed in an overlapped fashion via the focusing systems under illumination light having the same wave length as that of the exposure light IL. Then, the images so viewed are photo-taken by the imaging elements, and image signals from the imaging elements are supplied to an image processing system of the main control system 9. In the image processing system, the image signals are converted into digital signals, and, positional displacement amounts of the images of the alignment marks with respect to the images of the reference marks are determined by image process (treatment), and the determined positional displacement amounts are supplied to a calculation processing system of the main control system 9.

On the other hand, the wafer 5 is held on a wafer stage 6 via a wafer holder (not shown), and the wafer stage 6 can be moved in the Y-direction at a constant speed and serves to perform the stepping of the wafer 5 in the X and Y-directions. The wafer stage 6 includes a Z levelling stage for adjusting a Z-axis position and an inclined angle of the wafer 5 and a rotation stage for adjusting a rotational angle of the wafer 5 within a predetermined range. An X-axis movable mirror 7XM and a Y-axis movable mirror 7YM are disposed on the wafer stage 6, and an X-axis laser interferometer 7X and a Y-axis laser interferometer (not shown) are disposed in an opposed relation to the movable mirrors 7XM, 7YM so that information regarding an X-coordinate XW, an Y-coordinate YW and a rotational angle of the wafer stage 6 always obtained from the laser interferometers is supplied to the main control system 9. The main control system 9 controls the operation of the wafer stage 6 on the basis of the positional information. In the illustrated embodiment, the exposure is effected in a step-and-scan manner in which a scanning exposure operation for successively transferring the pattern image of the reticle onto shot areas on the wafer 5 by scanning the reticle stage 2 and the wafer stage 6 in a synchronous manner, and an operation for stepping the wafer stage so as to move the next shot area of the wafer to a next scan start position are repeated. The co-ordinate system including the X-coordinate XW and Y-coordinate YW of the wafer stage 6 measured by the interferometers 7X and the like is called the co-ordinate system (XW, YW) of the wafer stage.

Further, as disclosed in U.S. Pat. No. 5,502,311, at a lower part of the projection optical system 4 on both side thereof, there is provided a focus position detection system comprising a projection optical system 19A for projecting a plurality of slit images onto the surface of the wafer 5 and a a beam-condensing optical system 19B for collecting light reflected from the wafer 5 to re-focus the slit images and for generating a plurality of focus signals corresponding to the positional displacement amounts. The focus signals so generated are supplied to a Z levelling stage driving system (not shown). For example, by driving the Z levelling stage within the wafer stage 6 to maintain the focus signals at predetermined levels, auto-focusing of the wafer 5 is effected.

In order to perform the alignment of the wafer, there are provided an off-axis type and an image processing type (hereinafter called "FIA (Field Image Alignment) type") wafer alignment sensors 16, as disclosed in U.S. Pat. No. 5,493,403, which are secured to the side surface of the projection optical system 4. Further, there is provided a TTL (through-the-lens) type and two light flux interference type (hereinafter called "LIA (Laser Interferometric Alignment) type") Y-axis wafer alignment sensor 17Y which is disposed at a position rightwardly of and above the projection optical system 4, and there is provided another LIA type X-axis wafer alignment sensor (not shown) which is disposed at a position rotated by 90 degrees from the wafer alignment sensor 17Y around the optical axis AX. The FIA type wafer alignment sensor 16 serves not only to form an image of the mark to be detected on an internal index plate under an illumination light AL1 having a relatively wide band but also to overlap the mark image with an image of an index mark formed on the index plate so as to relay the overlapped one to imaging elements such as CCDS. The imaging elements include two imaging elements having scanning directions corresponding to the X- and Y-directions, respectively. Accordingly, by treating image signals from these imaging elements in the image processing system of the main control system 9, positional displacement amounts of the image mark (image of the mark to be detected) relative to the index mark in both X- and Y-directions can be detected. Further, by adding the X-coordinate and Y-coordinate of the wafer stage 6 to these positional displacement amounts, an X-coordinate and a Y-coordinate of the mark to be detected (in the co-ordinate system of the wafer stage) can be determined.

On the other hand, a pair of laser beams AL2 emitted from the LIA type. Y-axis wafer alignment sensor 17Y is incident on the projection optical system 4 via a reflection mirror 18, and the laser beams AL2 passed through the projection optical system 4 is illuminated, with a predetermined cross angle, on a Y-axis wafer mark having a diffraction grating formed on the wafer 5 along the Y-direction at a predetermined pitch. As a result, interference light comprised of ±first-order diffraction lights of the pair of laser beams AL2 is generated in substantially vertical direction from the wafer mark, and this interference light is sent, through the projection optical system 4 and the mirror 18, to a photoelectric sensor in the wafer alignment sensor 17Y, where it is converted to a light beat signal. The light beat signal is supplied to s signal processing system of the main control system 9. In the signal processing system, a phase of the light beat signal is compared with a phase of a reference beat signal, and a detected phase difference is supplied to the calculation processing system of the main control system 9. The Y-coordinate of the mark to be detected is determined on the basis of both the phase difference and the Y-coordinate of the wafer stage 6. Similarly, the X-coordinate of an X-axis wafer mark having diffraction grating can be detected by using a LIA type X-axis wafer alignment sensor (not shown).

In this way, according to the illustrated embodiment, two kinds of wafer alignment sensors can be used properly corresponding to the degree of the flatness of the surface of the wafer, for example. As to other wafer alignment sensors, as disclosed in U.S. Pat. No. 5,151,750, alignment sensors of laser-step-alignment (LSA) type for scanning a slit-shaped laser beam and a wafer mark having dot arrangement relative to each other can be used. When such an alignment sensor are used, a relative distance (i.e., base line amount) between the projection position of the pattern image of the reticle 1 (for example, a position of a center of the projected image) and the detection position of the alignment sensor (for example, a position of detection center) must be previously measured. The detection center of the alignment sensor 16 of FIA type is a center of an image of the index mark on the index plate projected on the wafer stage 6, for example, and the detection center of the alignment sensor 17Y of LIA type is a position of the mark (to be detected) when the phase of the light beat signal of the interference light generated from said mark coincides with the phase of the reference beat signal (i.e., when the phase difference=0), for example. Further, the reticle 1 must be positioned with respect to the wafer stage 6. To this end, a reference mark member 8 is fixed onto the wafer stage 6 in the vicinity of the wafer 5 so that an upper surface of the reference mark member 8 becomes flush with an upper surface of the wafer 5.

The reference mark member 8 is constituted by a light-permeable substrate on which various reference marks are formed. Among these reference marks, reference marks used in the reticle alignment are light-emitting marks illuminated from below the reference mark member. That is to say, in FIG. 2, within the wafer stage 6, illumination light IL1 having the same wave length band as the exposure light IL is directed to the bottom of the reference mark member 8 through an optical fiber 12 so that the illumination light IL1 is illuminated onto a pair of reference marks on the reference mark member 8 through a light-condensing lens 13, a beam splitter 14 and a mirror 15. Actually, the illumination light IL1 is divided into four luminous fluxes so that further two pairs of reference marks on the reference mark member 8 are illuminated from below.

Next, shapes and arrangements of the alignment marks and the reference marks used during the performance of both reticle alignment and base line check in the illustrated embodiment will be explained.

Figure 3:
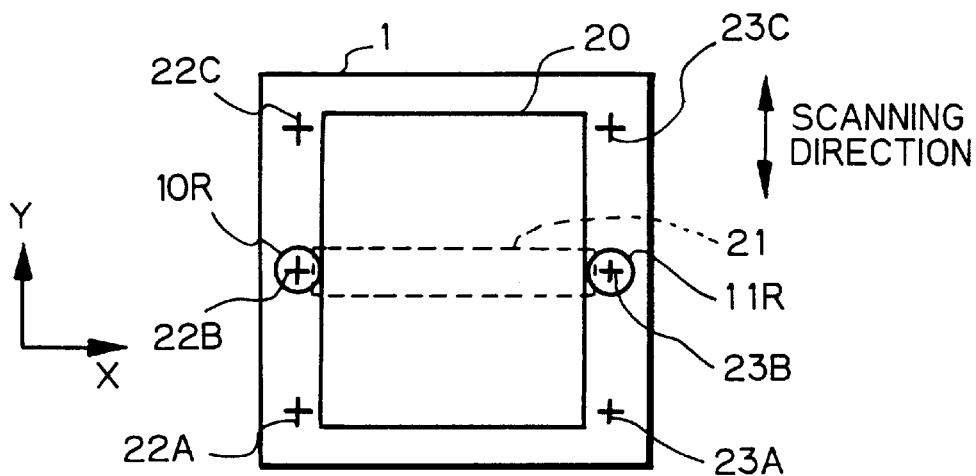
FIG. 3 is a plan view showing an arrangement of alignment marks on a reticle (1) of FIG. 2.
Figure 5A:
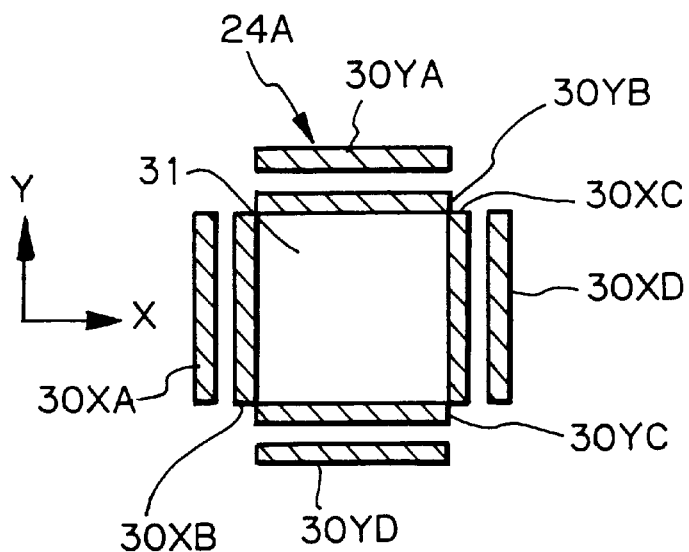
FIG. 5A is an enlarged plan view showing a reference mark (24A)
Figure 5B:
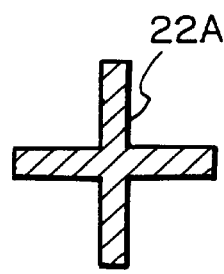
FIG. 5B is an enlarged plan view showing an alignment mark (22A) on the reticle.

FIG. 3 shows an arrangement of the alignment marks formed on the reticle 1. In FIG. 3, a first pair of alignment marks 22A, 23A are formed along the X-direction with the interposition of a pattern area 20 of the reticle 1, and, at positions corresponding to the alignment marks 22A, 23A in the Y-direction, there are formed a second pair of alignment marks 22B, 23B and a third pair of alignment marks 22C, 23C. The first to third pairs are equidistantly spaced apart from each other in the Y-direction. The second pair of alignment marks 22B, 23B are disposed at a central portion of the reticle 1 regarding the Y-direction. As shown in FIG. 5B, the alignment mark 22A comprises a cross-shaped and light-shield type pattern, and other alignment marks 22B, 22C, 23A–23C have similar shapes.

An observing area 10R of the RA microscope 10 (FIG. 2) and another observing area 11R of the RA microscope 11 are set in the vicinity of ends (-X-direction end and +X-direction end) of the slit-shaped illumination zone 21, respectively, so that, by moving the reticle 1 in the Y-direction, the alignment marks 22A–22C and 23A–23C can be brought to positions within the observing areas 10R, 11R. In FIG. 3, the alignment marks 22B, 23B are positioned within the observing areas 10R, 11R, respectively.

Figure 4:
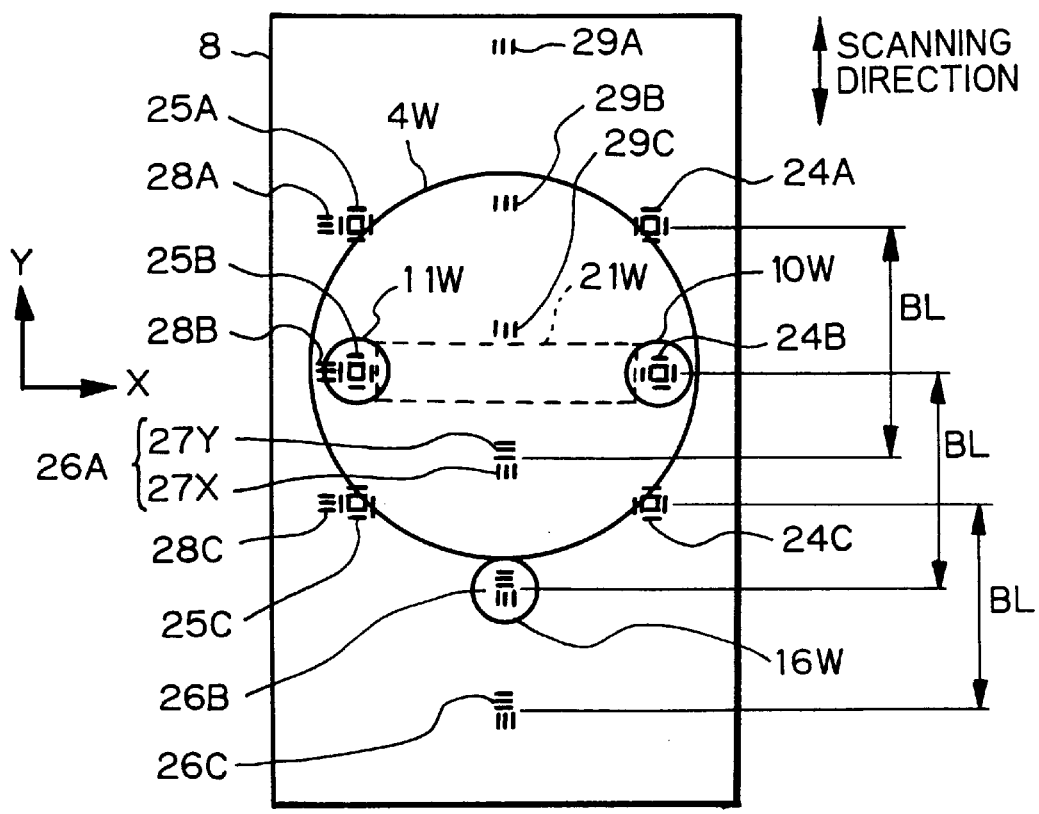
FIG. 4 is a plan view showing an arrangement of reference marks on a reference mark member (8) of FIG. 2.

FIG. 4 shows an arrangement of the reference marks on the reference mark member 8. In FIG. 4, three identical-shaped reference marks 24A–24C arranged along the Y-direction are formed on the reference mark member 8 in the vicinity of an edge in +X-direction, and, symmetrically with them, three identical-shaped reference marks 25A–25C arranged along the Y-direction are formed on the reference mark member 8 in the vicinity of an edge in -X-direction. As shown in FIG. 5A, the reference mark 24A is constituted by four linear light-shield patterns 30XA–30XD disposed along the X-direction with the interposition of a square opening pattern 31 and four linear light-shield patterns 30YA–30YD disposed along the Y-direction with the inter-position of the square opening pattern 31. A dimension of the opening pattern 31 is selected so that the alignment mark 22A shown in FIG. 5B is contained within an projected image of the opening pattern 31 on the reticle 1. The reference marks 24A–24C and 25A–25C are light-emitting marks illuminated by illumination light having the same wave length as the exposure light from below.

Since the projection optical system 4 according to the illustrated embodiment performs inversion-projection, the arrangement of the reference marks 24A–24C and 25A–25C on the reference mark member 8 corresponds to an arrangement obtained by inverting and reducing the design arrangement of the alignment marks 22A–22C and 23A–23C on the reticle 1 by the design projection magnification $\beta_0$ of the projection optical system 4. Accordingly, as shown in FIG. 4, when centers of the central reference marks 24B, 25B are aligned with a center line of an exposure zone 21W conjugate with the slit-shaped illumination zone 21 (FIG. 3), the reference marks 24B, 25B are contained within observing areas 10W, 11W (on the wafer stage) of the RA microscopes 10, 11 conjugate with the observing areas 10R, 11R (FIG. 3). From this condition, by moving the wafer stage of FIG. 2 in the Y-direction, the other reference marks 24A, 24C and 25A, 25C can be brought to positions within the observing areas 10W, 11W.

In the illustrated embodiment, as disclosed in U.S. Pat. No. 5,243,195, a reference mark 26A for the FIA type wafer alignment sensor 16 is formed on the reference mark member 8. The reference mark 26A is spaced apart from a center line connecting between the reference marks 24A and 25A by a distance BL in -Y-direction. Similarly, a reference mark 26B having the same configuration as the reference mark 26A is spaced apart from a center line connecting between the reference marks 24B and 25B by the distance BL in -Y-direction, and a reference mark 26C having the same configuration as the reference mark 26A is spaced apart from a center line connecting between the reference marks 24C and 25C by the distance BL in -Y-direction. The distance BL corresponds to a design value of the base line amount of the wafer alignment sensor 16 in the Y-direction. Accordingly, as shown in FIG. 4, in the condition that the central reference marks 24B, 25B are contained within the observing areas 10W, 11W, respectively, the corresponding reference mark 26B is contained within an observing area 16W of the wafer alignment sensor 16 substantially and externally contacting with an effective exposure field 4W of the projection optical system 4 including the slit-shaped exposure zone 21W. Similarly, in the conditions that the other reference marks 24A, 25A and 24C, 25C are contained within the observing areas 10W, 11W, in turns, the reference marks 26A and 26C are contained within the observing area 16W, respectively.

Figure 6:
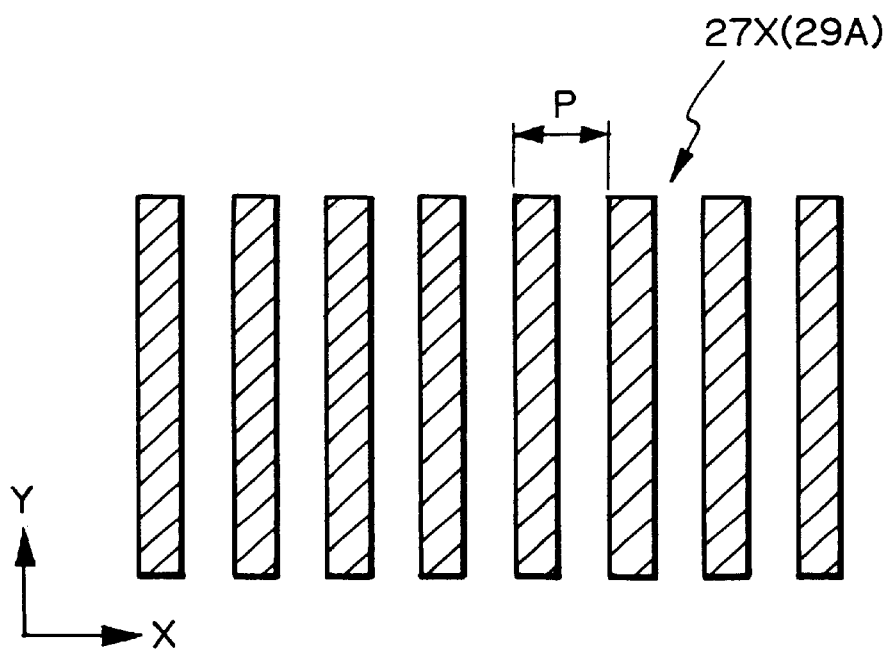
FIG. 6 is an enlarged plan view showing reference marks for an alignment sensor.

The reference mark 26A is constituted by an X-axis reference mark 27X and a Y-axis reference mark 27Y having a shape obtained by rotating the reference mark 27X by 90 degrees. As shown in FIG. 6, the X-axis reference mark 27X comprises a line-and-space pattern in which reflective line patterns are disposed side by side in the X-direction at a pitch P. The reference mark 27X can also be used as the diffraction grating mark.

In FIG. 4, when the reference marks 24A, 25A are contained within the observing areas 10W, 11W, LIA type reference marks 28A and 29A are formed, respectively, on an area on which the laser beam AL2 from the LIA type Y-axis wafer alignment sensor 17Y (FIG. 2) is illuminated and an area on which a laser beam from the X-axis wafer alignment sensor (not shown) is illuminated. As shown in FIG. 6, the reference mark 29A is a diffraction grating mark having the same shape as the reference mark 27X, and the reference mark 28A has a shape obtained by rotating the reference mark 29A by 90 degrees. In this case, a positional displacement amount $BL_{LX}$ of the LIA type reference mark 29A in the X-direction and a positional displacement amount $BL_{LX}$ of the reference mark 28A in the Y-direction with respect to the center of the reference marks 24A, 25A correspond to design values of the base line amounts of the LIA type X-axis wafer alignment sensor 17X and the Y-axis wafer alignment sensor 17Y, respectively. Similarly, LIA type reference marks 29B, 28B are formed to be spaced apart from the center of the reference marks 24B, 25B by distances $BL_{LX}$, $BL_{LY}$, respectively, and LIA type reference marks 29C, 28C are formed to be spaced apart from the center of the reference marks 24C, 25C by distances $BL_{LX}$, $BL_{LY}$, respectively.

Next, an example of the performance of reticle alignment and the base line check effected by the projection exposure apparatus according to the illustrated embodiment will be explained with reference to flow charts shown in FIGS. 1A and 1B.

First of all, the reticle is exchanged (step 101) so as to firstly load the reticle 1 on the reticle stage 2 in FIG. 2. Then, in a step 102, in the condition that the reference marks on the reference mark member 8 are illuminated, by driving the wafer stage 6, for example, the images of the first reference marks 24A, 25A on the reference mark member 8 are moved to positions within the observing areas of the RA microscopes 10, 11 and then the wafer stage 6 is stopped. Then, in a step 103, by driving the reticle stage 2, the alignment marks are searched by the RA microscopes 10, 11 while moving the reticle 1 in the Y-direction to bring the first alignment marks 22A, 23A on the reticle 1 to positions within the observing areas 10R, 11R of the RA microscopes 10, 11.

Figure 7:
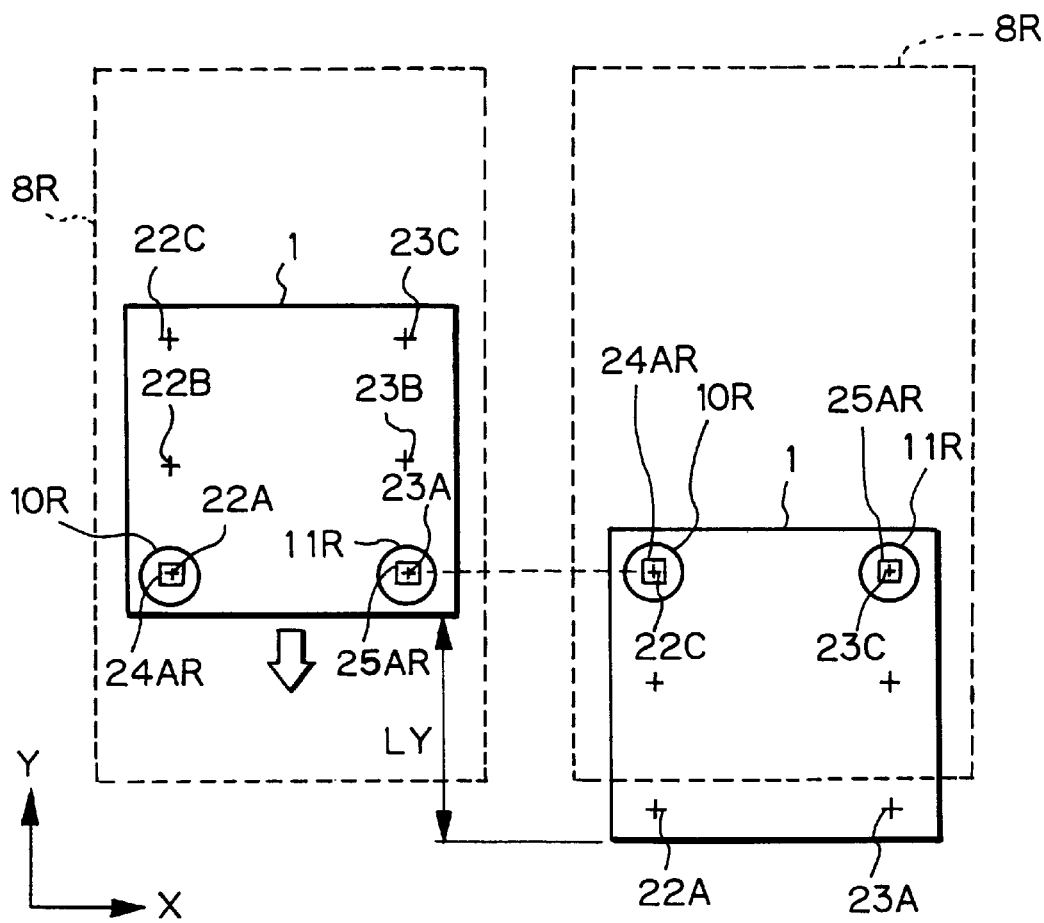
FIGS. 7A to 7C are explanatory views showing a case where positional displacement amounts of different alignment marks on the reticle (1) are successively measured while the reference mark member (8) remains stationary.

FIG. 7A shows a condition that an image 8R of the reference mark member 8 is projected onto the reticle 1. In FIG. 7A, images (reference mark images) 24AR, 25AR of the reference marks 24A, 25A are contained within the observing areas 10R, 11R of the RA microscopes 10, 11, respectively, and the alignment marks 22A, 23A are positioned at centers of the reference mark images 24AR, 25AR, respectively. By minutely moving the reticle stage 2 in the X-direction, Y-direction and rotational direction, the positional displacements of the alignment marks 22A, 23A in the Y-direction with respect to the reference marks images 24AR, 25AR are eliminated and the positional displacements of the alignment marks 22A, 23A in the X-direction with respect to the reference marks images 24AR, 25AR are made substantially symmetrical. In this condition, the reticle stage 2 is stopped. As a result, the centers of the alignment marks 22A, 23A are positioned substantially at the centers of the reference marks images 24AR, 25AR, and a straight line passing through the alignment marks 22A, 23A becomes substantially parallel with another straight line passing through the reference marks images 24AR, 25AR. In this condition, on one hand, the positional displacement amounts ($\Delta xA1$, $\Delta yA1$) of the alignment mark 22A in the X-, Y-directions with respect to the reference marks image 24AR are detected by the RA microscope 10, and, on the other hand, the positional displacement amounts ($\Delta xB1$, $\Delta yB1$) of the alignment mark 23A in the X-, Y-directions with respect to the reference marks image 25AR are detected by the RA microscope 11. In the main control system 9, average values ($\Delta x1$, $\Delta y1$) of such positional displacement amounts are calculated and the calculated result is stored. In this case, the measured values ($XW_0$, $YW_0$) measured in the coordinate system (XW, YW) of the wafer stage and the measured values ($XR_1$, $YR_1$) measured in the co-ordinate system (XR, YR) of the reticle stage are also stored.

In the illustrated embodiment, while an example wherein the positional displacement amounts of the alignment marks 22A, 23A with respect to the images of the reference marks 24A, 25A are detected at the reticle side was explained, as shown in FIG. 7C, this is equivalent to the fact that the image of the reticle 1 is projected on the wafer stage 6 and the positional displacement amounts of the projected images 22AW, 23AW (alignment mark images) of the alignment marks 22A, 23A with respect to the reference marks 24A, 25A are detected. In this case, since the FIA type reference mark 26A is contained within the observing area 16W (see FIG. 7C) of the wafer alignment sensor 16 in FIG. 2, in a step 104, the positional displacement amounts ($\Delta xC1$, $\Delta yC1$) of the reference mark 26A in the X-, Y-directions with respect to the detection center are detected by the wafer alignment sensor 16, and the detected result is stored in the main control system 9. Similarly, although the positional displacement amounts of the corresponding reference mark can be detected by the LIA type alignment sensor 17Y and the like shown in FIG. 2, since the correction of the base line thereof is the same as that of the alignment sensor 16, explanation thereof will be omitted.

In a next step 105, the reticle stage 2 is driven in the Y-direction to move the reticle in the −Y-direction as shown in FIG. 7A, thereby bringing the second alignment marks 22B, 23B to positions within the reference mark images 24AR, 25AR in the observing areas 10R, 11R. Then, by moving the reticle stage 2 minutely in the Y-direction, the centers of the second alignment marks 22B, 23B are positioned substantially at the centers of the reference mark images 24AR, 25AR. In this condition, the reticle 1 is stopped. Then, the positional displacement amounts ($\Delta xA2$, $\Delta yA2$), ($\Delta xB2$, $\Delta yB2$) of the second alignment marks 22B, 23B in the X-, Y-directions with respect to the reference mark images 24AR, 25AR are detected by the RA microscopes 10, 11. In the main control system 9, average values ($\Delta x2$, $\Delta y2$) of such positional displacement amounts are calculated and the calculated result is stored. In this case, the measured values ($XR_2$, $YR_2$) measured with respect to the co-ordinate system (XR, YR) of the reticle stage are also stored. The coordinates of the wafer stage have not been changed up to now.

In a next step 106, the reticle stage 2 is further driven in the −Y-direction to move the third alignment marks 22C, 23C to positions within the reference mark images 24AR, 25AR. Then, as shown in FIG. 7B, by moving the reticle stage 2 minutely in the Y-direction, the centers of the third alignment marks 22C, 23C are positioned substantially at the centers of the reference mark images 24AR, 25AR. In this condition, the reticle 1 is stopped. Then, the positional displacement amounts ($\Delta xA3$, $\Delta yA3$), ($\Delta xB3$, $\Delta yB3$) of the third alignment marks 22C, 23C in the X-, Y-directions with respect to the reference mark images 24AR, 25AR are detected by the RA microscopes 10, 11. In the main control system 9, average values ($\Delta x3$, $\Delta y3$) of such positional displacement amounts are calculated and the calculated result is stored. In this case, the measured values ($XR_3$, $YR_3$) measured with respect to the co-ordinate system (XR, YR) of the reticle stage are also stored.

Then, in a step 107, in the main control system 9, average values ($\Delta xR$, $\Delta yR$) of the above-mentioned three positional displacement amounts ($\Delta x1$, $\Delta y1$), ($\Delta x2$, $\Delta y2$), ($\Delta x3$, $\Delta y3$) are calculated, and this data is used as offset of the co-ordinate system (XR, YR) of the reticle stage with respect to the co-ordinate system (XW, YW) of the wafer stage. This means that, for example, considering the central second alignment marks 22B, 23B on the reticle 1 as a reference, when the co-ordinate system (XR, YR) of the reticle stage has coordinate values $(XR_0, YR_0)$ which are obtained by subtracting the average values ($\Delta xR$, $\Delta yR$) from the coordinate values $(YR_2, YR_2)$ stored in the step 105, and when the co-ordinate system (XW, YW) of the wafer stage has the coordinate values $(XW_0, YW_0)$ stored in the step 103 (the same in the step 105), the reticle 1 is overlapped with the reference marks 24A, 25A on the reference mark member 8 with high accuracy. Accordingly, when the projection magnification $\beta$ (from the reticle to the wafer) of the projection optical system 4 is used, in the scanning exposure, by controlling so that an amount obtained by subtracting the coordinate values $(XR_0, YR_0)$ from the coordinate system (XR, YR) of the reticle stage and then by multiplying the amount by $\beta$ becomes a displacement amount of the wafer stage 6, high overlapping accuracy can be obtained in the vicinity of the center of the pattern.

In a next step 108, the main control system 9 calculates the magnification error (e. g., pattern error) of the reticle 1 in the scanning direction on the basis of the positional displacement amounts ($\Delta x1$, $\Delta y1$), ($\Delta x3$, $\Delta y3$) of the alignment marks obtained in the steps 103 and 106. In this case, when it is assumed that a distance (measured by the laser interferometer) through which the reticle stage 2 is actually moved in the Y-direction from one condition that the alignment marks 22A, 23A are substantially aligned with the reference mark images 24AR, 25AR as shown in FIG. 7A to another condition that the alignment marks 22C, 23C are substantially aligned with the reference mark images 24AR, 25AR as shown in FIG. 7B is "LY" and a design distance from the alignment marks 22A, 23A to the alignment marks 22C, 23C in the Y-direction is "$LY_0$", the magnification error $\Delta MRY$ of the reticle 1 in the scanning direction (Y-direction) is represented as follows:

$$\Delta MRY = (LY + \Delta y1 - \Delta y3 - LY_0)/LY_0 \quad (1)$$

Further, when the projection magnification C (sign is plus) of the projection optical system 4 is used, if the magnification error of the reticle 1 in the scanning direction is zero, the pattern (on the reticle 1) having a design length of $LY_0$ in the Y-direction provides an image having a Y-direction length of $\beta \cdot LY_0$ on the wafer. Then, it is assumed that Y-direction lengths of patterns previously formed within the shot areas on the wafer 5 at the previous steps coincide with the design values. Therefore, in order to reduce the overlapping error, a scanning speed VR of the reticle stage in the Y-direction and a scanning speed VW of the wafer stage 6 (in an opposite direction) during the scanning exposure must satisfy the following relation:

$$VR \cdot VW = LY_0 \cdot (1 + \Delta MRY) : \beta \cdot LY_0$$

Accordingly, the main control system 9 determines a scanning speed ratio VW/VR between the both stages as follows:

$$VW/VR = (1 + \Delta MRY) \quad (2)$$

Then, in a step 109, the main control system 9 determines the base line amounts (BLX, BLY) of the alignment sensor 16 in the X-, Y-directions. That is to say, as shown in FIG. 4, since the distance from each of the centers of the reference marks 24A and 25A to the center of the reference mark 26A in the Y-direction is BL, by using the projection magnification $\beta$, the average positional displacement amount ($\Delta xR$, $\Delta yR$) obtained in the step 107 and the positional displacement amounts ($\Delta xC1$, $\Delta yC1$) of the reference mark 26A obtained in the step 104, the base line amounts (BLX, BLY) are represented as follows. Incidentally, in consideration of an inverse projection of the projection optical system 4, the positional displacement amounts of the reticle were converted into the positional displacement amounts on the wafer stage:

$$BLX = -\beta \cdot \Delta xR - \Delta xC1 \quad (3A)$$

$$BLY = BL - \beta \cdot \Delta yR - \Delta yC1 \quad (3B)$$

Until the next base line check is performed, the base line amounts (BLX, BLY) so obtained are used.

Incidentally, in the step 108, the magnification error of the reticle 1 in the non-scanning direction can also be determined. More specifically, a distance between the reference marks 24A and 25A on the reference mark member 8 in the X-direction is known (this distance is assumed as AL). Accordingly, when the projection magnification (1/$\beta$) of the projection optical system 4 from the wafer to the reticle is used, a distance between the reference mark images 24AR and 25AR on the the reticle 1 in the X-direction becomes AL/$\beta$, which is a design value of an X-direction distance between the alignment marks 22A–22C and 23A–23C under the projection magnification $\beta$. Further, when it is assumed that an average value of the positional displacement amounts $\Delta xA1$–$\Delta xA3$ of the alignment marks 22A–22C in the non-scanning direction is $\Delta xA$ and another average value of the positional displacement amounts $\Delta xB1$–$\Delta xB3$ of the alignment marks 23A–23C in the non-scanning direction is $\Delta xB$, the magnification error $\Delta MRX$ of the reticle 1 in the non-scanning direction (X-direction) is represented as follows:

$$\Delta MRX = (\Delta xB - \Delta xA)/(AL/\beta) \quad (4)$$

In order to correct the magnification error of the reticle 1 in the non-scanning direction, as disclosed in U.S. Pat. No. 5,117,255, for example, by providing a mechanism for minutely moving some of lenses of the projection optical system 4 in FIG. 2 or a mechanism for controlling gas pressure in closed spaces between some of lenses of the projection optical system 4, the projection magnification of the projection optical system 4 can be corrected.

Next, in FIG. 1B, an example of alignment and exposure operation successively effected regarding a lot of wafers by using the projection exposure apparatus according to the illustrated embodiment will be explained. In this example, an off-axis type alignment sensor 16 is used.

In this case, first of all, in a step 111, the wafer on the wafer stage 6 is exchanged. In a next step 112, in order to effect the base line check, by driving the wafer stage 6 while illuminating the reference marks on the reference mark member 8, the images of the reference marks 24A, 25A on the reference mark member 8 are moved to positions within the observing areas 10R, 11R of the RA microscopes 10, 11. Then, the wafer stage 6 is stopped at a position where the co-ordinate system of the wafer stage 6 has the coordinate values $(XW_0, YW_0)$ measured in the step 103. Further, a pair of alignment marks firstly measured on the reticle 1 (i.e., first alignment marks 22A, 23A, in this case) are set to have the same positional relation as that in the measurement in the step 103. This means that the coordinate system of the reticle stage 2 is set to the coordinate values $(XR_1, YR_1)$ in the measurement in the step 103.

In a next step 113, the positional displacement amounts ($\Delta xAi$, $\Delta yAi$) of one of the alignment marks in the X-, Y-directions with respect to the reference mark image 24AR is detected by the RA microscope 10, and the positional displacement amounts (ΔxBi, ΔyBi) of the other alignment marks in the X-, Y-directions with respect to the reference mark image 25AR is detected by the RA microscope 11. In the main control system 9, average values (Δxi, Δyi) of such positional displacement amounts are calculated and the calculated result is stored. In a next step 114, the average positional displacement amounts of the reticle 1 with respect to the wafer stage are corrected. The average positional displacement amounts (ΔxR, ΔyR) mentioned above are average values of the three positional displacement amounts (Δx1, Δy1), (Δx2, Δy2), (Δx3, Δy3) measured in the steps 103–106. This time, the previous average values are replaced by the determined average values (Δxi, Δyi) to determine new average values (ΔxR', ΔyR'), and, these values are used as offset of the co-ordinate system (XR, YR) of the reticle stage with respect to the co-ordinate system (XW, YW) of the wafer stage.

If necessary, magnification error of the reticle 1 in the scanning direction is determined. As shown in the step 108, since the magnification error of the reticle 1 in the scanning direction can be determined based on the distance between the alignment marks 22A, 23A and 22C, 23C positioned on both ends of the reticle 1 (FIG. 3) in the scanning direction, if the alignment marks measured in the step 112 are alignment marks 22A, 23A or 22C, 23C, the magnification error in the scanning direction can be determined. In this case, by replacing "Δy1" or "Δy3" in the above-mentioned equation (1) by a Y-coordinate value Δyi of the average values of the measured positional displacement amounts of the reticle 1, new magnification error ΔMRY' in the scanning direction is calculated. By replacing the magnification error "ΔMRY" in the above-mentioned equation (2) by the magnification error ΔMRY', the scanning speed ratio VW/VR is renewed. Hereinafter, the renewed scanning speed ratio will be used.

On the other hand, in case that the alignment marks measured in the step 112 are alignment marks 22B, 23B, only the correction of the average positional displacement amounts of the reticle 1 is effected, and the magnification error in the scanning direction is not renewed.

In a next step 115, by replacing "(ΔxR, ΔyR)" in the above equations (3A), (3B) by the positional displacement amounts (ΔxR', ΔyR') of the reticle 1 determined in the step 114 and by using the positional displacement amounts (ΔxC1, ΔyC1) of the reference mark 26A determined in the step 113 in the above equations (3A), (3B), new base line amounts (BLX, BLY) of the wafer alignment sensor 16 in the X-, Y-directions are determined. And, in a step 116, first of all, the alignment regarding the wafer is effected. In this case, for example, as disclosed in U.S. Pat. No. 4,780,617, when an enhanced-global-alignment system (EGA system) is used, coordinate values of wafer marks provided on the predetermined number of shot areas (sample shots) selected on the wafer are measured by the off-axis type alignment sensor 16, and, by effecting statistical treatment of the measured results, the co-ordinates of the arrangement of all of the shot areas on the wafer are calculated. Thereafter, new co-ordinates are obtained by correcting the calculated arrangement co-ordinates with the base line amounts (BLX, BLY) determined in the step 115. Then, by using the new co-ordinates, the wafer stage 6 is moved step-by-step to successively move the shot areas to the scan start position. After the emission of the exposure light IL is started, by driving the wafer stage 6 and the reticle stage 2 with the above-mentioned scanning speed ratio, the pattern image of the reticle 1 is successively transferred onto the shot areas.

After the exposure regarding the single wafer is finished, in a step 117, it is judged whether a remaining wafer is existed or not. If existed, the program is returned to the step 111. Then, the steps from the step 111 (exchange of wafer) to the step 116 (exposure) are repeated. In the step 117, if there is no remaining wafer, the exposure process is finished. In the illustrated embodiment, when the second or more wafers are exposed, in the step 112, the positional displacement amounts of the second alignment marks 22B, 23B, third alignment marks 22C, 23C and first alignment marks 22A, 23A, - - - on the reticle 1 are successively measured whenever the wafer is exchanged. In the step 114, the average positional displacement amounts of the reticle 1 are corrected on the basis of the measured results. In the position measurement of the alignment marks 22B, 23B or 22C, 23C, the magnification error of the reticle 1 in the scanning direction is determined. Accordingly, the magnification error of the reticle 1 in the scanning direction can be determined by using the pair of RA microscopes 10, 11 disposed in the non-scanning direction without reducing the through-put. By correcting the scanning speed ratio in accordance with the magnification error, the overlapping accuracy can be improved.

In the illustrated embodiment, while an example that the base line check is performed whenever the wafer is exchanged was explained, the base line check may be performed by using different alignment marks whenever the exposure for the predetermined number of wafers is finished.

In the illustrated embodiment, only the first reference marks 24A, 25A were used as the reference marks on the reference mark member 8. However, since three pairs of reference marks are provided in the illustrated embodiment, in the reticle alignment, when the reticle 1 is moved, the reference mark member 8 may also be moved. In this case, the steps 102–104 shown in FIG. 1A can be used.

Figure 8:
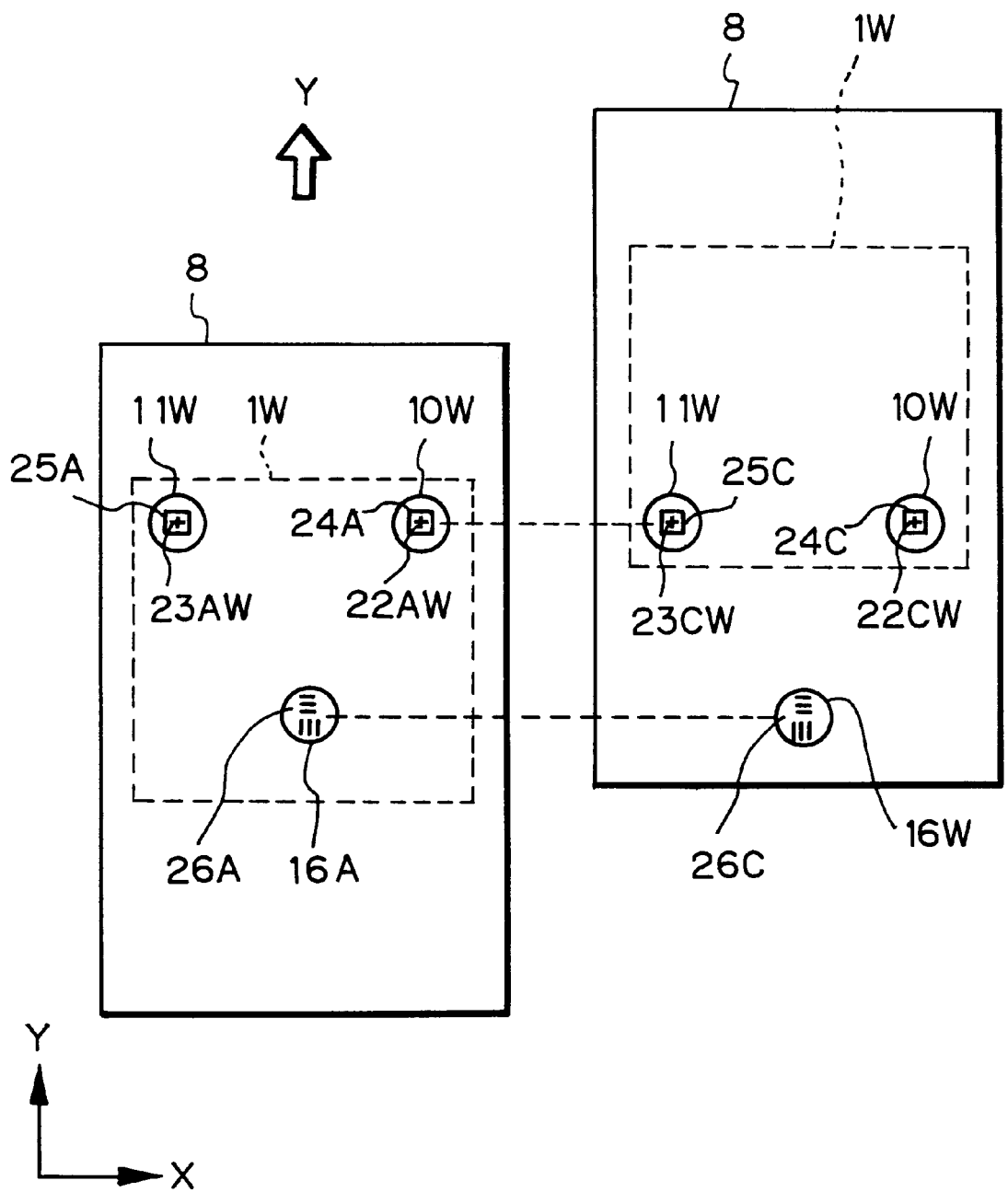
FIGS. 8A and 8B are explanatory views showing a case where positional displacement amounts of different alignment marks on the reticle (1) are successively measured while the reference mark member (8) and the reticle (1) are moved correspondingly.

FIG. 8A shows a condition that the image 1W of the reticle 1 is projected on the reference mark member 8. In FIG. 8A, the reference mark 24A and the mark image 22AW are contained within the observing area 10W of the RA microscope 10 and the reference mark 25A and the mark image 23AW are contained within the observing area 11W of the RA microscope 11, and the reference mark 26A is contained within the observing area 16W of the alignment sensor 16. In this condition, in correspondence to the above-mentioned step 103, the positional displacement amounts (ΔxA1, ΔyA1), (ΔxB1, ΔyB1) of the alignment marks 22A, 23A are detected by the RA microscope 10, 11. However, according to this alteration, in correspondence to the step 105, the wafer stage 6 is driven to move the reference mark member 8 in +Y-direction by the distance between the reference marks 24A and 24B, and the reticle stage 2 is driven by a distance obtained by multiplying the above distance by an inverse number (1/β) of the projection magnification β of the projection optical system 4 to move the reticle 1 in −Y-direction (the image 1W of the reticle 1 is moved in +Y-direction). As a result, since the second reference marks 24B, 25B (FIG. 4) and the images of the second alignment marks 22B, 23B are contained within the observing areas 10W, 11W in FIG. 8A, in this condition, the positional displacement amounts (ΔxA2, ΔyA2), ΔxB2, ΔyB2) of the alignment marks 22B, 23B are detected by the RA observing microscopes 10, 11, and the positional displacement amounts of the reference mark 26B is detected by the alignment sensor 16.

Then, in correspondence to the step 106, the wafer stage 6 is driven to move the reference mark member 8 in +Y-direction by a distance between the reference marks 24B and 24C, and the reticle stage 2 is driven by a distance obtained by multiplying the above distance by the inverse number (1/β) to move the reticle 1 in −Y-direction. As a result, as shown in FIG. 8B, since the third reference marks 24C, 25C and the images 22CW, 23CW of the third alignment marks 22C, 23C are contained within the observing areas 10W, 11W, the positional displacement amounts (ΔxA3, ΔyA3), (ΔxB3, ΔyB3) of the alignment marks 22C, 23C are detected by the RA observing microscopes 10, 11, and the positional displacement amounts of the reference mark 26C are detected by the alignment sensor 16. Thereafter, in correspondence to the step 107, by averaging three sets of positional displacement amounts, the average positional displacement amounts of the reticle 1 are determined. Since the positional displacement amounts so determined are positional displacement amounts corresponding to the position of the wafer stage 6 in the scanning exposure, the offset of the co-ordinate system of the reticle stage with respect to the co-ordinate system of the wafer stage can be obtained more correctly.

Also in this alteration, similar to the step 108, although the magnification error of the reticle 1 in the scanning direction is determined on the basis of the above-mentioned equation (1), since the magnification error so determined is based on the actual moving amount of the wafer stage 6, it is considered that such magnification error is more accurate magnification error, because the value of the ratio between the measured value of the laser interferometer 3X at the reticle side and the the measured value of the laser interferometer 7X at the wafer side are taken into account. Accordingly, by determining the scanning speed ratio on the basis of this magnification error, it is expected that the overlapping error can be reduced.

Also in this alteration, in the exposure regarding one lot of wafers, whenever the wafer is exchanged or whenever the exposure regarding a plurality of wafers is finished, in correspondence to the step 112, the positional displacement amounts of the different alignment marks on the reticle 1 are successively detected in order to perform the base line check. Further, in the alteration, in addition, the second reference marks 24B, 25B, third reference marks 24C, 25C and first reference marks 24A, 25A, - - - on the reference mark member 8 are successively detected. Consequently, the magnification error of the reticle 1 in the scanning direction can be measured more accurately.

Incidentally, when the positions of the reference marks measured whenever the wafer is exchanged is varied, a position where the wafer is loaded on the wafer stage 6 may be varied accordingly.

Figure 9:
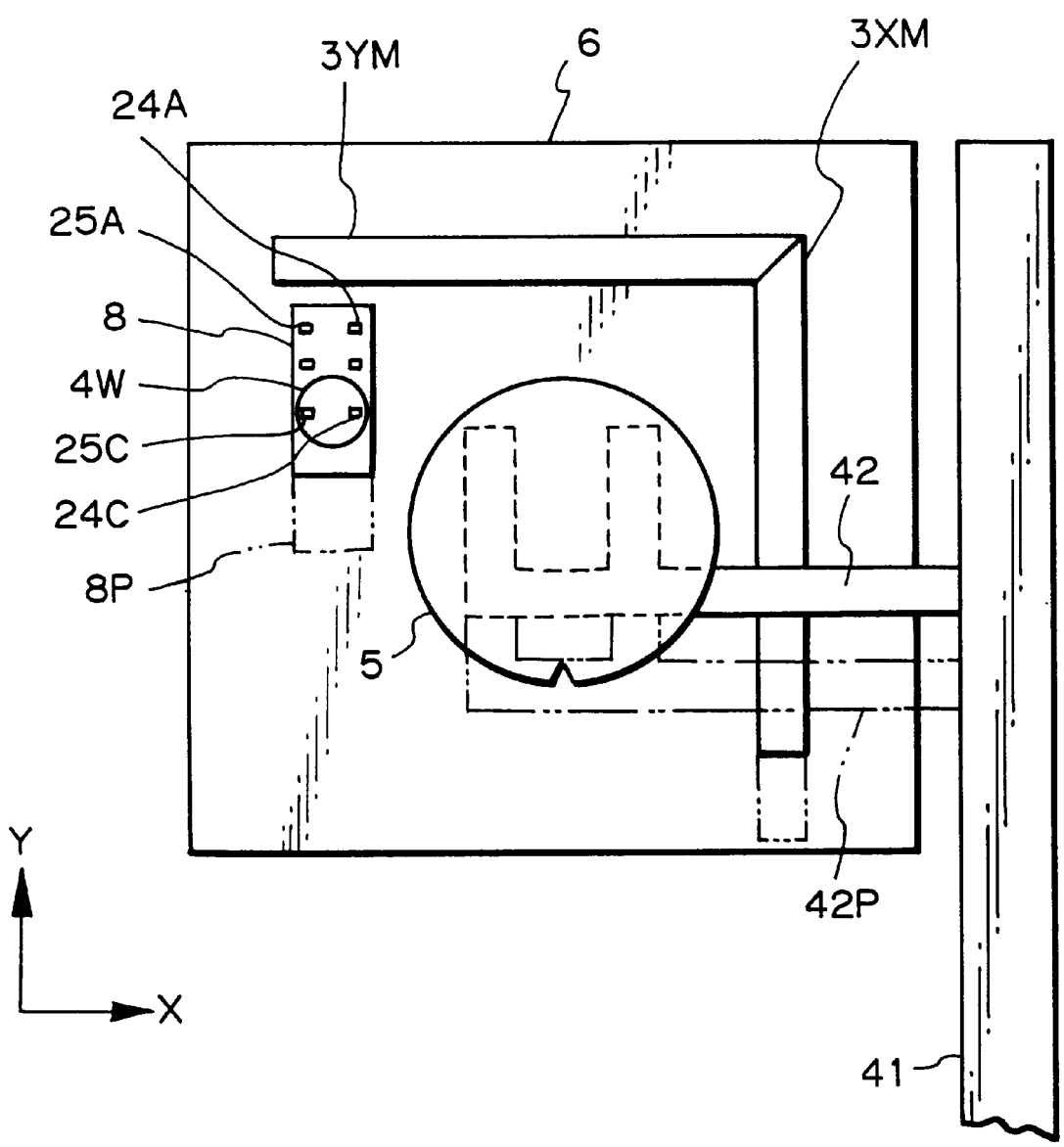
FIG. 9 is a plan view showing a wafer stage and a part of a wafer loader system of the projection exposure apparatus of FIG. 2.

FIG. 9 is a plan view of the wafer stage 6 of the projection exposure apparatus in FIG. 2. In FIG. 9, a slider 41 of a wafer loader system is disposed at a side of the wafer stage 6 and a loading arm 42 is mounted on the slider 41 so as to be movable in the Y-direction. FIG. 9 shows a condition that the wafer 5A is being loaded by the loading arm 42. In this condition, the reference marks 24C, 25C on the reference mark member 8 are contained within the effective exposure field 4W of the projection optical system 4, and the base line check is performed by using such reference marks 24C, 25C. Thereafter, when the next wafer is exposed, the reference marks 24A, 25A on the reference mark member 8 are moved to a position within the effective exposure field 4W, and the base line check is performed by using such reference marks 24A, 25A.

In this case, since the reference mark member 8 is moved in the −Y-direction up to a position 8P shown by the two-dot and chain line, a position of a wafer holder (not shown) is moved in the −Y-direction accordingly. Therefore, in order to load a wafer to be exposed next on the wafer stage 6, the loading arm 42 is set to a position 42P shown by the two-dot and chain line, and the wafer is transferred onto the wafer stage 6 at that position. Similarly, when the base line check is performed by using the central reference marks on the reference mark member 8, the position of the loading arm 42 may be displaced accordingly. As a result, even when the positions of the reference marks are varied whenever the wafer is exchanged, the through-put of the exposure process is not worsened.

In the above-mentioned embodiment, while three pairs of alignment marks 22A–22C, 23A–23C were disposed on the reticle 1 along the scanning direction as shown in FIG. 3, in order to determine the magnification error in the scanning direction, at least two pairs of alignment marks may be provided along the scanning direction. Further, four or more pairs of alignment marks may be provided along the scanning direction. Further, when the magnification error of the reticle 1 only in the scanning direction is determined, it is not necessary that the positional displacement amounts of the corresponding alignment marks are detected simultaneously by the pair of RA microscopes 10, 11, but, the positional displacement amounts of two alignment marks formed on the reticle 1 along the scanning direction may be measured successively by one of the RA microscopes.

Figure 1B:
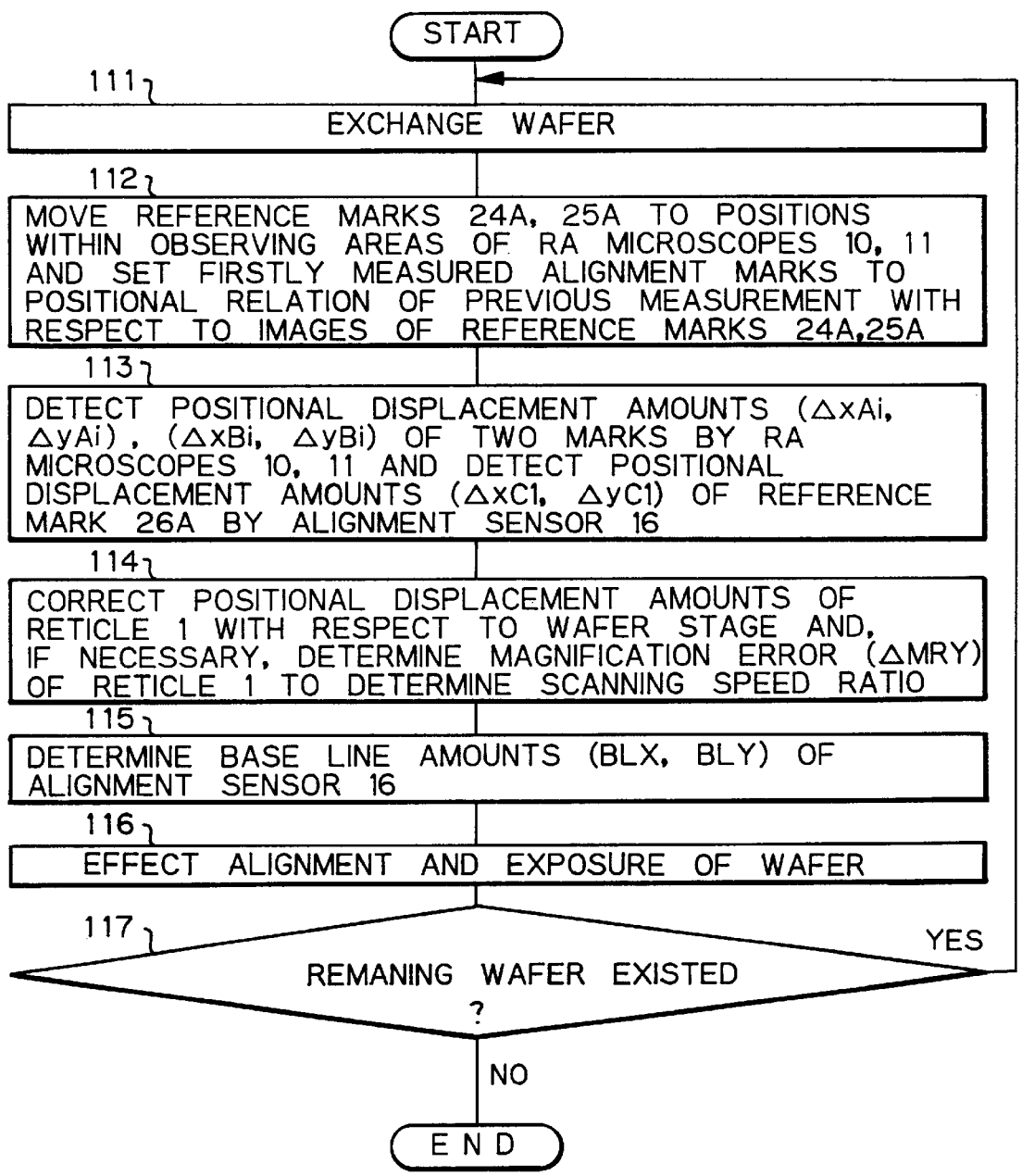

Further, regarding the reference marks 24A–24C, 25A–25C on the reference mark member 8, when only the operation of FIGS. 1A and 1B is performed, only one pair of reference marks may be provided. When the reference mark member 8 is also moved in response to the movement of the reticle 1, at least two pairs of reference marks may be provided.

The present invention is not limited to the above-mentioned embodiment, but, various modifications can be made without departing from the scope of the invention.

The entire disclosure of Japanese Patent Application No. 8(1996)-331,846 filed on Dec. 12, 1996 including specification, claims, drawings and summary is incorporated herein by reference in its entirety.

What is claimed is:

1. A projection exposure method in which a photosensitive substrate is aligned with a mask by detecting a position of at least one alignment mark on said photosensitive substrate by using a mark detection system and in which a pattern of said mask is transferred onto said photosensitive substrate by scanning said mask and said photosensitive substrate in a synchronous manner, comprising:

a first step for positioning said mask in such a manner that a first mark among a plurality of alignment marks formed on said mask along a scanning direction thereof is brought to a predetermined position and for measuring a projection position of an image of said first mark;

a second step for determining a relative positional relationship between a projection position of an image of the pattern of said mask and a detection position of said mark detection system on the basis of the projection position of the image of the first mark;

a third step for positioning said mask in such a manner that a second mark different from the first mark among the plurality of alignment marks formed on said mask along the scanning direction thereof is brought to a predetermined position and for measuring a projection position of an image of the second mark, after the pattern of said mask is transferred onto each of the predetermined number of photosensitive substrates by using the determined relative positional relationship; and a fourth step for determining the relative positional relationship between the projection position of the image of the pattern of said mask and the detection position of said mark detection system on the basis of the projection position of the image of the second mark after the third step and for determining a magnification error in the scanning direction thereof on the basis of the projection positions of the images of the first and second marks.

2. A projection exposure method according to claim 1, wherein, in correspondence to the plurality of alignment marks on said mask, a plurality of reference marks are formed along the scanning direction thereof on a stage on which said photosensitive substrate is rested, so that, when said mask is moved in order to position one of the alignment marks at said predetermined position, said stage is moved in order to position the corresponding one reference mark among the plurality of reference marks at a position corresponding to the predetermined position.

3. A projection exposure method according to claim 1, wherein, the second step comprising steps for measuring the projection positions of the images of the plurality of alignment marks on said mask, respectively, and for determining the relative positional relationship between the projection position of the pattern image of said mask and the detection position of said mark detection system on the basis of measured results.

4. A scanning exposure method for transferring a pattern on a mask onto a substrate through a projection optical system, by moving the mask and the substrate in a synchronous manner, comprising:
   a first step of obtaining an information on projection position of an image of the pattern of the mask by detecting a first mark formed on the mask;
   a second step of obtaining an information on projection position of an image of the pattern of the mask by detecting a second mark which is formed apart from the first mark on the mask in a synchronous movement direction; and
   a third step of obtaining a magnification error in the synchronous movement direction, based on the obtained information on the first mark and the second mark, said magnification error being generated between said first and second steps.

5. A projection exposure method according to claim 4, further comprising a step of adjusting a ratio between a movement speed of the mask and a movement speed of the substrate based on the magnification error to transfer the pattern of the mask onto the substrate.

6. An exposure method for transferring a pattern on a mask onto a substrate through a projection optical system, comprising:
   a first step of detecting a first mark formed on the mask while measuring the position of the mask;
   a second step of detecting a second mark formed on the mask while measuring the position of the mask, a position of the second mark on the mask being different from that of the first mark thereon; and
   a third step of obtaining a magnification error based on an information on a position of the mask, an information on detection of the first mark and an information on detection of the second mark, said magnification error being generated between said first and second steps.

7. An exposure method according to claim 6, further comprising a step of moving at least one of lens elements constituting the projection optical system, based on the magnification error.

8. An exposure method which projects an image of a pattern formed on a mask onto a substrate, comprising:
   a first step of detecting a first mark formed on the mask;
   a second step of detecting a second mark formed on the mask, a position of the second mark on the mask being different from that of the first mark thereon; and
   a third step of obtaining a projection error based on an information on detection of the first mark and an information on detection of the second mark, said projection error being generated between said first and second steps.

9. The exposure method according to claim 8, further comprising the step of:
   irradiating light to the mask between said first step and said second step.

10. The exposure method according to claim 8, further comprising the step of:
   transferring a pattern of said mask onto said substrate between said first step and said second step.

11. The exposure method according to claim 8, wherein said first mark is apart from said second mark on the mask in a first direction, and said projection error is magnification error of the mask in the first direction.

12. An exposure method comprising the steps of:
   transferring a pattern on a mask onto at least one substrate;
   detecting a first mark among a plurality of marks formed on either the mask or a substrate stage holding said substrate;
   obtaining a first correction information according to the result of detecting said first mark;
   transferring the pattern on the mask onto at least one substrate different from said substrate using said first correction information;
   detecting a second mark different from said first mark after said transferring the pattern using said first correction information; and
   obtaining a second correction information to be used for the next transferring step according to the result of detecting said second mark.

13. The exposure method according to claim 12, wherein said transferring step comprises transferring a pattern on a mask onto one substrate.

14. The exposure method according to claim 12, wherein said transferring step comprises transferring a pattern on a mask onto a plurality of substrates.

15. The exposure method according to claim 12, wherein the number of said plurality of marks formed on the mask or a substrate stage holding said is greater than two.

16. The exposure method according to claim 12, wherein said plurality of marks are formed in the predetermined positions on the substrate stage,
   said method further comprising the step of:
   positioning said first mark or said second mark at a predetermined position before said detecting step.

17. The exposure method according to claim 12, wherein said first correction information and said second correction information are used to correct a positional relationship between said mask and said substrate.

18. The exposure method according to claim 12,
wherein said first correction information and said second correction information are used to correct a magnification error of the mask.

19. The exposure method according to claim 18,
wherein said first mask is apart from said second mark on the mask in a first direction, and said magnification error of the mask is an error in the first direction.

20. The exposure method according to claim 19, said transferring step comprising the step of:
scanning said mask and said substrate in said first direction in a synchronous manner, and controlling a value of a ratio between a scanning speed of said mask and a scanning speed of said substrate to correct said magnification error of the mask in said direction.

* * * * *